US009412825B2

(12) United States Patent  
Yasumoto et al.

(10) Patent No.: US 9,412,825 B2  
(45) Date of Patent: Aug. 9, 2016

(54) SEMICONDUCTOR DEVICE (71) Applicant: KABUSHIKI KAISHA TOSHIBA, Tokyo (JP)

(72) Inventors: Takaaki Yasumoto, Kawasaki Kanagawa (JP); Naoko Yanase, Inagi Tokyo (JP); Kazuhide Abe, Kawasaki Kanagawa (JP); Takeshi Uchihara, Kawaguchi Saitama (JP); Yasunobu Saito, Nomi Ishikawa (JP); Toshiyuki Naka, Nonoichi Ishikawa (JP); Akira Yoshioka, Nomi Ishikawa (JP); Tasuku Ono, Nonoichi Ishikawa (JP); Tetsuya Ohno, Nomi Ishikawa (JP); Hidetoshi Fujimoto, Kawasaki Kanagawa (JP); Shingo Masuko, Kanazawa Ishikawa (JP); Masaru Furukawa, Himeji Hyogo (JP); Yasunari Yagi, Ibo Hyogo (JP); Miki Yumoto, Kawasaki Kanagawa (JP); Atsuko Iida, Yokohama Kanagawa (JP); Yukako Murakami, Chigasaki Kanagawa (JP); Takako Motai, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/472,956

(22) Filed: Aug. 29, 2014

(65) Prior Publication Data  
US 2015/0263152 A1 Sep. 17, 2015

(30) Foreign Application Priority Data  
Mar. 14, 2014 (JP) ................. 2014-052765

(51) Int. Cl.  
*H01L 29/66* (2006.01)  
*H01L 29/40* (2006.01)  
(Continued)

(52) U.S. Cl.  
CPC ............ *H01L 29/408* (2013.01); *H01L 29/423* (2013.01); *H01L 29/7786* (2013.01); *H01L 29/2003* (2013.01)

(58) Field of Classification Search  
CPC .................................. H01L 29/66431  
See application file for complete search history.

(56) References Cited

U.S. PATENT DOCUMENTS

| 7,612,390 B2 | 11/2009 | Saxler et al. |
| 2012/0267638 A1 | 10/2012 | Lee et al. |

(Continued)

FOREIGN PATENT DOCUMENTS

| JP | 2607199 B2 | 5/1997 |
| JP | 2004282514 A | 10/2004 |
| JP | 2006179540 A | 7/2006 |
| JP | 201218972 A | 1/2012 |

OTHER PUBLICATIONS

Akira Ishida, et al. "Optical Modulation by Acoustic Domains Generated in Piezoelectric Semiconductors," The Journal of the Institute of Television Engineers of Japan, 1970, pp. 167-174.

(Continued)

Primary Examiner — Daniel Whalen  
(74) Attorney, Agent, or Firm — Patterson & Sheridan, LLP (57) ABSTRACT

A semiconductor device includes a GaN-based semiconductor layer, a source electrode on the GaN-based semiconductor layer, a drain electrode on the GaN-based semiconductor layer, and a gate electrode formed on the GaN-based semiconductor layer between the source electrode and the drain electrode. A first layer is in contact with the GaN-based semiconductor layer between the gate electrode and the drain electrode.

11 Claims, 6 Drawing Sheets

(51) Int. Cl.
*H01L 29/423* (2006.01)
*H01L 29/778* (2006.01)
*H01L 29/20* (2006.01)

(56) References Cited

U.S. PATENT DOCUMENTS

2013/0062693 A1* 3/2013 Tanaka .................. H01L 29/404
 257/339
2013/0127521 A1* 5/2013 Simin et al. .................. 327/530
2013/0140578 A1* 6/2013 Yu et al. .......................... 257/76

OTHER PUBLICATIONS

Yasushi Okazaki "Ceramic Dielectric Engineering," Gakken-sha, 1969, pp. 546-563.
Korean Office Action dated Oct. 24, 2015, filed in Korean counterpart Application No. 10-2014-0075465, 8 pages (with translation).
Korean Office Action dated Feb. 4, 2016, filed in Korean counterpart Application No. 10-2014-0075465, 10 pages (with translation).

* cited by examiner

SEMICONDUCTOR DEVICE

CROSS-REFERENCE TO RELATED APPLICATION

This application is based upon and claims the benefit of priority from Japanese Patent Application No. 2014-052765, filed Mar. 14, 2014, the entire contents of which are incorporated herein by reference.

FIELD

Embodiments described herein relate to a semiconductor device.

BACKGROUND

GaN-based semiconductor devices for power electronics or a high-frequency switching devices has been in development. However, GaN-based semiconductor devices have some drawbacks relating to electrical characteristics thereof even though in general GaN-based devices can have higher breakdown voltages and lower resistance.

For example, "current collapse" is one of the possible drawbacks relating to the electrical characteristics of the GaN-based semiconductor device. "Current collapse" refers to a phenomenon where when a drain voltage is applied to a transistor after previously applying a high drain voltage to the transistor, the ON-state resistance of the transistor rises. One of the causes of the current collapse is considered to be that channel electrons are trapped by a surface of a GaN-based semiconductor or the like.

DETAILED DESCRIPTION

An embodiment provides a semiconductor device where variation in electrical characteristics is suppressed.

According to a first embodiment, a semiconductor device includes a GaN-based semiconductor layer and a source electrode and a drain electrode spaced from each other on the GaN-based semiconductor layer in a first direction. A gate electrode is between the source electrode and the drain electrode on the GaN-based semiconductor layer in the first direction. A first conductive layer (which may also be referred to as a first protective layer) is contacting a surface of the GaN-based semiconductor layer between the gate electrode and the drain electrode in the first direction.

In general, according to one embodiment, a semiconductor device includes: a GaN-based semiconductor layer; a source electrode formed on the GaN-based semiconductor layer; a drain electrode formed on the GaN-based semiconductor layer; a gate electrode formed on the GaN-based semiconductor layer between the source electrode and the drain electrode; and a first conductive layer formed in contact with the GaN-based semiconductor layer between the gate electrode and the drain electrode.

Hereinafter, embodiments of the present disclosure are explained by reference to drawings. In the explanation made hereinafter, substantially similar elements are given the same reference symbol, and the explanation of elements and the like which has been previously explained once may be omitted when appropriate.

In this disclosure, "GaN-based semiconductor" is a general term for a semiconductor material which comprises at least one of GaN (gallium nitride), AlN (aluminum nitride), InN (indium nitride) and intermediate compositions between these materials. Further, in this disclosure, AlGaN means a semiconductor material expressed by a composition formula of $Al_xGa_{1-x}N$ ($0<x<1$).

First Embodiment

A semiconductor device according to this embodiment includes: a GaN-based semiconductor layer; a source electrode formed on the GaN-based semiconductor layer; a drain electrode formed on the GaN-based semiconductor layer; a gate electrode formed on the GaN-based semiconductor layer between the source electrode and the drain electrode; and a first conductive layer formed in a contact with a portion of the GaN-based semiconductor layer between the gate electrode and the drain electrode.

Figure 1:
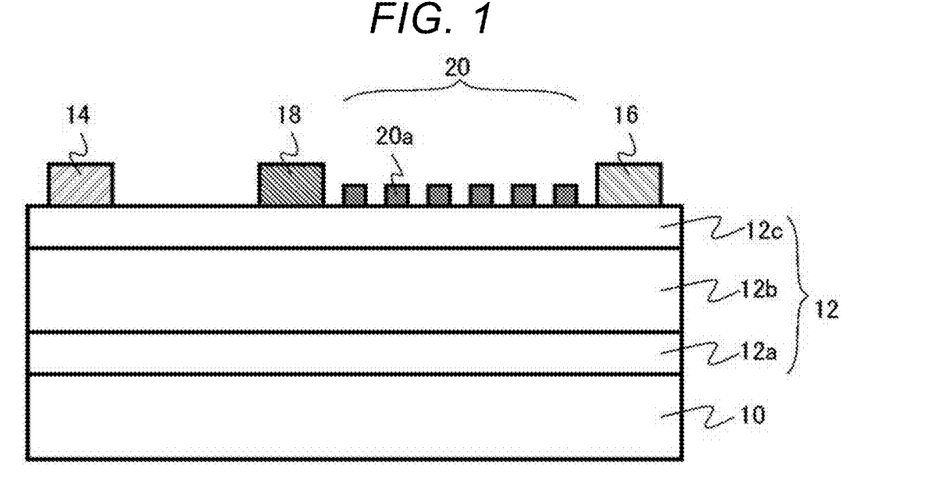
FIG. 1 is a schematic cross-sectional view illustrating a semiconductor device according to a first embodiment.
Figure 2:
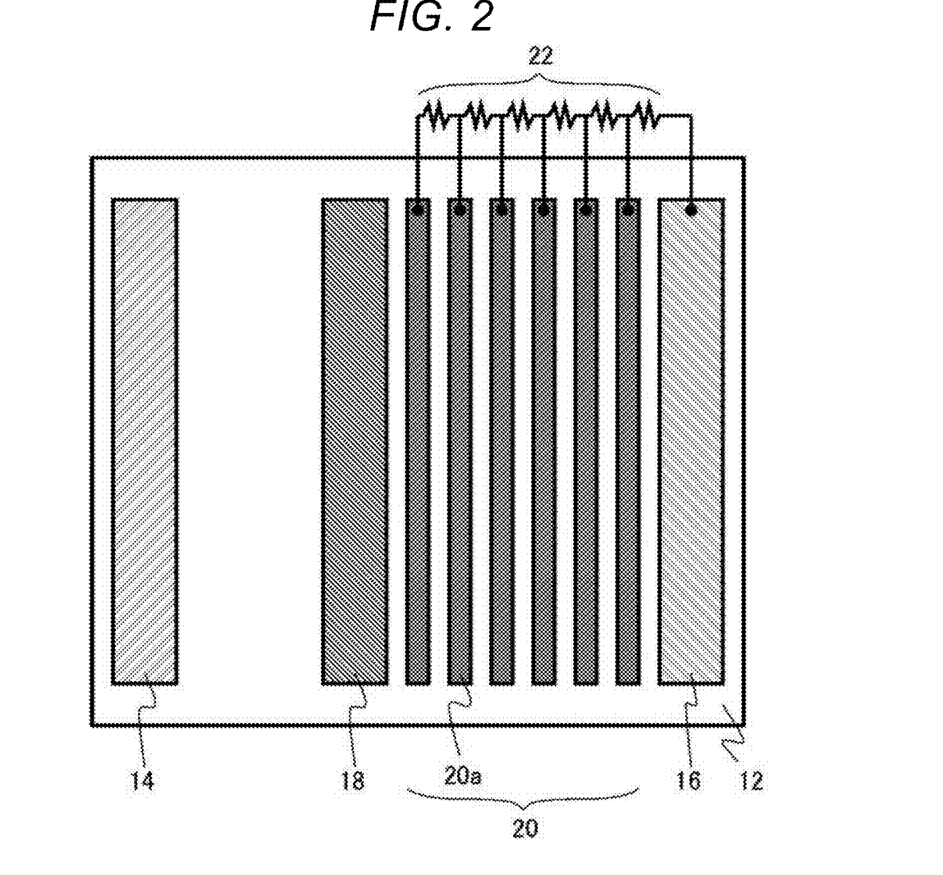
FIG. 2 is a schematic plan view illustrating the semiconductor device according to the first embodiment.

FIG. 1 is a schematic cross-sectional view illustrating the semiconductor device according to this first embodiment. FIG. 2 is a schematic plan view illustrating the semiconductor device according to this first embodiment. The semiconductor device according to this embodiment is a High Electron Mobility Transistor (HEMT) which uses a GaN-based semiconductor.

The semiconductor device according to this embodiment includes: a substrate 10; a GaN-based semiconductor layer 12; a source electrode 14; a drain electrode 16; a gate electrode 18; a first conductive layer 20; and a first resistor 22. The substrate 10 is made of GaN, for example. The substrate 10 may be a substrate made of SiC, Si, gallium oxide, sapphire or the like in place of a substrate made of GaN.

The GaN-based semiconductor layer 12 is formed on the substrate 10. The GaN-based semiconductor layer 12 includes a buffer layer 12a, a GaN layer 12b and an AlGaN layer 12c stacked from a substrate 10 surface. In this manner, the GaN-based semiconductor layer 12 has the laminated structure including the GaN layer 12b and the AlGaN layer 12c.

A surface of the GaN-based semiconductor layer 12 makes an angle of 0 degree or more to 1 degree or less with respect to a c plane (0001), for example. The crystal structure of the GaN-based semiconductor may approximate the hexagonal crystal structure. A plane of a hexagonal column where a c axis extending along an axial direction of the hexagonal column is set as a normal line (top plane of the hexagonal column) forms a c plane, that is, a (0001) plane.

The buffer layer 12a has a function of alleviating lattice mismatch between the substrate 10 and the GaN-based semiconductor layer 12. The buffer layer 12a has a multilayer structure of at least an AlGaN layer and a GaN layer, for example. A semiconductor material having a composition expressed by formula of $Al_xGa_{1-x}N$ (0<x<0.3) is used for forming the AlGaN layer 12c, for example.

The semiconductor device according to this embodiment is an HEMT where the GaN layer 12b forms a so-called "operation layer" (channel layer), and the AlGaN layer 12c forms a so-called "barrier layer" (electron supply layer).

The source electrode 14 and the drain electrode 16 are conductors made of metal, for example. It is desirable that the contact between the source electrode 14 and the GaN-based semiconductor layer 12 and the contact between the drain electrode 16 and the GaN-based semiconductor layer 12 be ohmic contact. The source electrode 14 and the drain electrode 16 can have the laminated structure formed of a titanium (Ti) layer and an aluminum (Al) layer, for example.

The gate electrode 18 is made of a conductor such as metal. In this embodiment, the contact between the gate electrode 18 and the GaN-based semiconductor layer 12 is a Schottky-type contact. The gate electrode 18 has the laminated structure formed of a nickel (Ni) layer and a gold (Au) layer, for example.

The first conductive layer 20 is formed directly contacting the GaN-based semiconductor layer 12 between the gate electrode 18 and the drain electrode 16. That is, as depicted in FIG. 1, the first conductive layer 20 is on the upper surface of the GaN-based semiconductor layer 12 and between gate electrode 18 and the drain electrode in a direction parallel to the upper surface of layer 12. In this embodiment, the first conductive layer 20 is formed in contact with the AlGaN layer 12c. The first conductive layer 20 removes electrical charge from the GaN-based semiconductor layer 12, and suppresses any uneven distribution of the electrical charge generated in the GaN-based semiconductor layer 12.

The first conductive layer 20 is made of metal, for example. The first conductive layer 20 has the laminated structure formed of a nickel (Ni) layer and a gold (Au) layer, for example. Contact between the first conductive layer 20 and the GaN-based semiconductor layer 12 is desirably Schottky-type contact to prevent electrons from flowing into the first conductive layer 20 from a two-dimensional electron gas (2DEG).

As illustrated in FIG. 2, the first conductive layer 20 has a plurality of linear portions 20a which extend parallel to the extension direction of the gate electrode 18. The first conductive layer 20 is electrically connected to the drain electrode 16.

In FIG. 2, a solid line which connects the first conductive layer 20 and the drain electrode 16 to each other schematically indicates that the first conductive layer 20 and the drain electrode 16 are electrically connected to each other. A similar solid line in other drawings also schematically indicates electrical connection. To be more specific, the first conductive layer 20 and the drain electrode 16 are, in this first embodiment, connected to each other by lines (wires) formed on the same layer as the first conductive layer 20 and the drain electrode 16. Alternatively, the connection between first conductive layer 20 and the drain electrode 16 using one or more vias (connections from one device layer to a different device layer) and lines (wires) formed on a layer different from the layer on which the first conductive layer 20 and the drain electrode 16 are formed.

First resistor 22 is between the first conductive layer 20 and the drain electrode 16. The first resistor 22 has a higher resistivity than the first conductive layer 20.

Although the first resistor 22 is indicated by a circuit symbol in FIG. 2, the first resistor 22 can made of a semiconductor, metal, metal oxide or the like having high electrical resistance. To be more specific, the first resistor 22 can be made of polycrystalline silicon, for example.

The first resistor 22 reduces a voltage applied between the first conductive layer 20 and the drain electrode 16 as well as an electric current which flows between the first conductive layer 20 and the drain electrode 16 by increasing a resistance between the first conductive layer 20 and the drain electrode 16 thus decreasing an influence of the first conductive layer 20 on a transistor operation.

In a transistor which uses a GaN-based semiconductor, a variation in transistor characteristics such as a current collapse becomes a drawback. The GaN-based semiconductor is a piezoelectric body so that polarization is generated thus generating an internal electric field. An HEMT makes use of a two-dimensional electron gas which is generated due to the internal electric field. On the other hand, due to the generation of the internal electric field, there exists a possibility that, for example, electrical charges escape from a two-dimensional electron gas or that localization of unexpected electrical charge occurs due to trapping of electrical charges generated by impact ionization. Such escaping of electrical charges and the localization of electrical charges may be factors which bring about undesirable variations in characteristics of the transistor.

In this first embodiment, an undesired electrical charge generated in the GaN-based semiconductor layer 12 may be released to the outside of a transistor through the first conductive layer 20. The undesired electrical charge is subsequently released to the drain electrode 16. As a result, a variation in transistor characteristics such as a current collapse may be suppressed. Accordingly, it is possible to achieve a transistor where a variation in electrical characteristics is suppressed.

Particularly, when a charge is trapped on a surface of the GaN-based semiconductor layer 12 between the gate electrode 18 and the drain electrode 16, the charge significantly influences the transistor characteristics. In this first embodiment, the first conductive layer 20 is formed between the gate electrode 18 and the drain electrode 16 and hence, a variation in transistor characteristics may be effectively suppressed.

As illustrated in FIG. 2, the first conductive layer 20 includes the plurality of linear portions 20a which extend parallel to the extension direction of the gate electrode 18 in the first embodiment. By dividing the conductive layer in this manner, it is possible to improve an electrical charge eliminating efficiency, and it is also possible to reduce the deterioration of transistor characteristics due to an increase in parasitic capacitance brought about by the provision of the first conductive layer 20 between the gate electrode 18 and the drain electrode 16.

Second Embodiment

Figure 3:
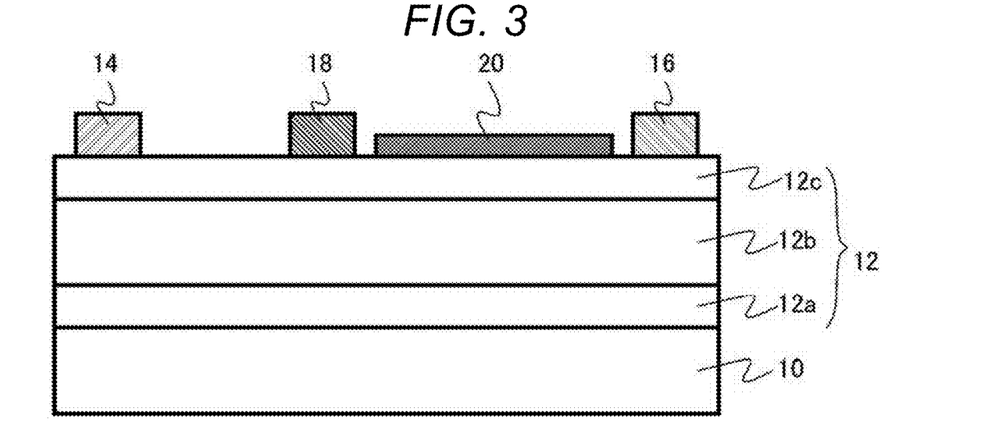
FIG. 3 is a schematic cross-sectional view illustrating a semiconductor device according to a second embodiment.
Figure 4:
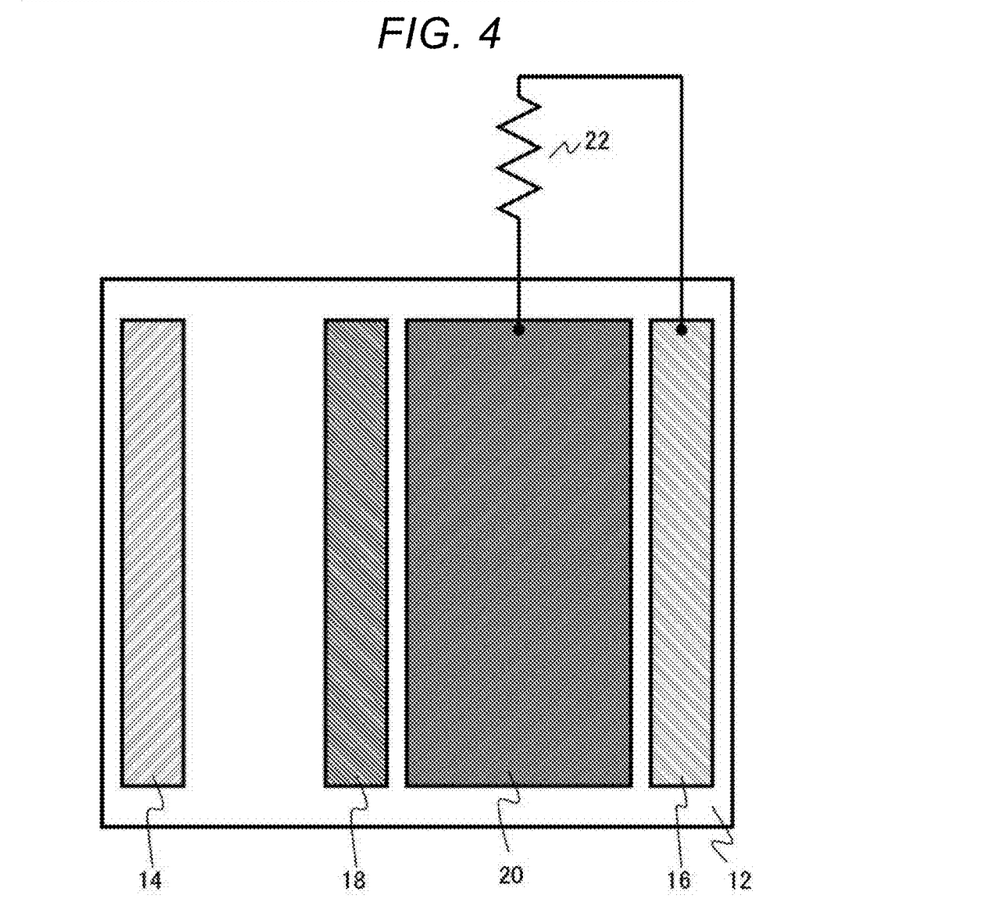
FIG. 4 is a schematic plan view illustrating the semiconductor device according to the second embodiment.

FIG. 3 is a schematic cross-sectional view illustrating the semiconductor device according to this second embodiment. FIG. 4 is a schematic plan view illustrating the semiconductor device according to this second embodiment.

As illustrated in FIG. 3 and FIG. 4, the first conductive layer 20 according to this embodiment is formed of a single planar element.

According to this second embodiment, an area of the first conductive layer 20 between the gate electrode 18 and the drain electrode 16 may be increased. That is, as compared to first embodiment, the coverage of the portion of the GaN-based semiconductor layer 12 between the gate electrode 18 and the drain electrode 16 by the first conductive layer 20 is increased. Accordingly, an undesired-charge removal efficiency may be enhanced by the increased coverage. Due to such a configuration, it is possible to achieve a transistor where a variation in electric characteristics is further suppressed.

Third Embodiment

Figure 5:
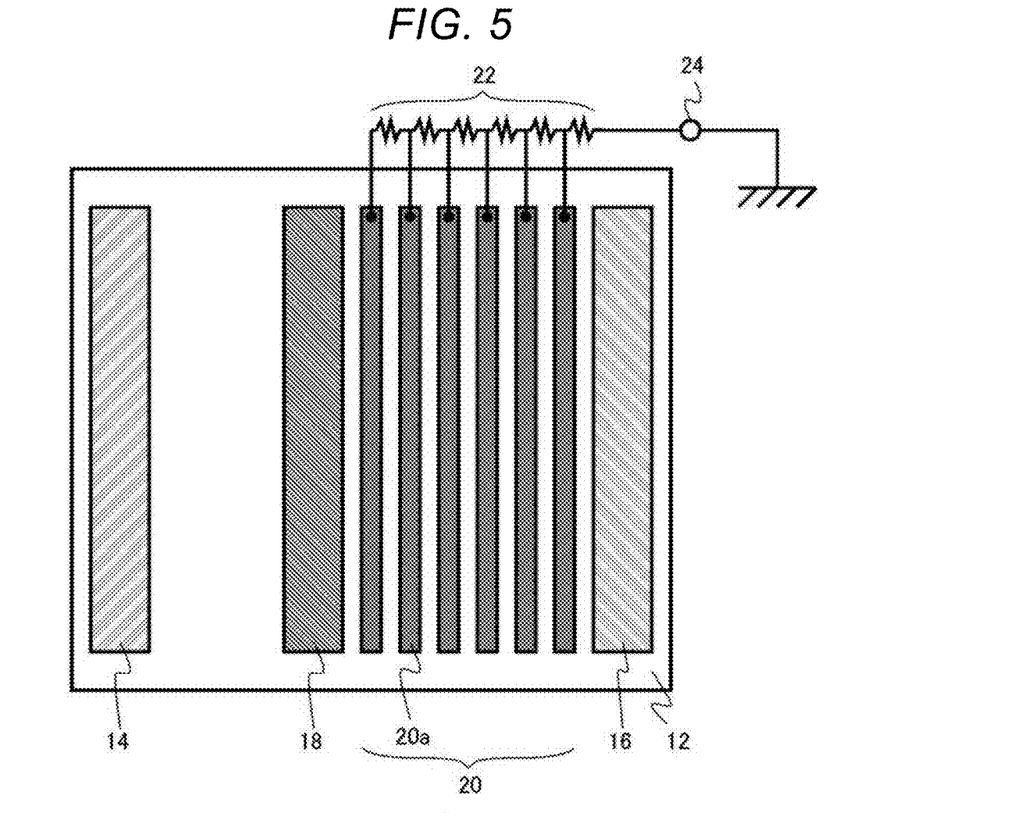
FIG. 5 is a schematic cross-sectional view illustrating a semiconductor device according to a third embodiment.

FIG. 5 is a schematic plan view illustrating the semiconductor device according to this third embodiment.

As illustrated in FIG. 5, the semiconductor device according to this third embodiment includes a ground terminal that is connected to a ground potential. The first conductive layer 20 is electrically connected to the ground terminal 24.

According to this third embodiment, the first conductive layer 20 is electrically connected to the independent ground terminal 24 instead of to the drain electrode 16. Accordingly, it is possible to further decrease any influence on device operation which might be due to a voltage being applied to the drain electrode 16 from the first conductive layer 20. Accordingly, it is possible to achieve a transistor where a variation in electrical characteristics is suppressed, and the transistor may acquire a stable operation.

Fourth Embodiment

Figure 6:
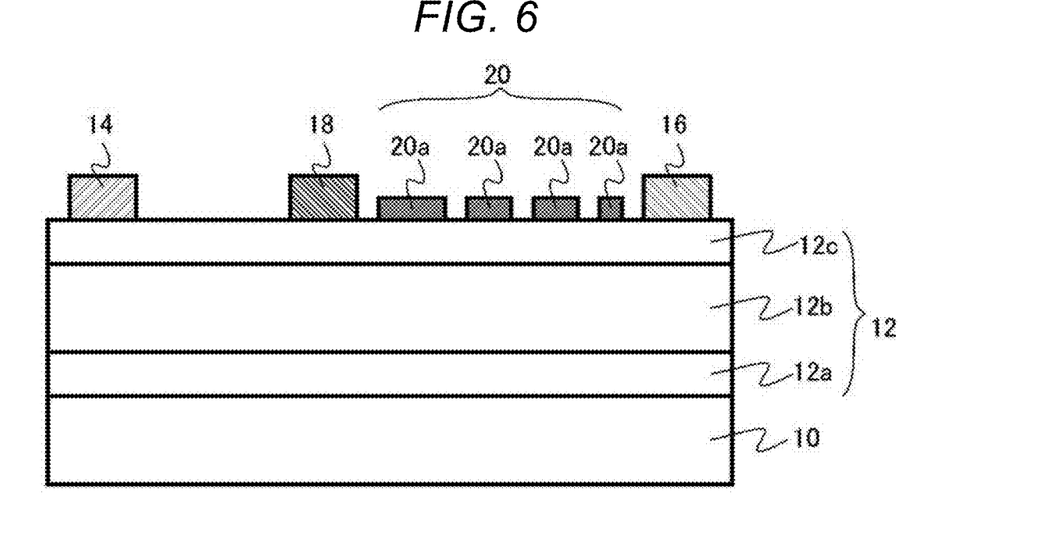
FIG. 6 is a schematic cross-sectional view illustrating a semiconductor device according to a fourth embodiment.
Figure 7:
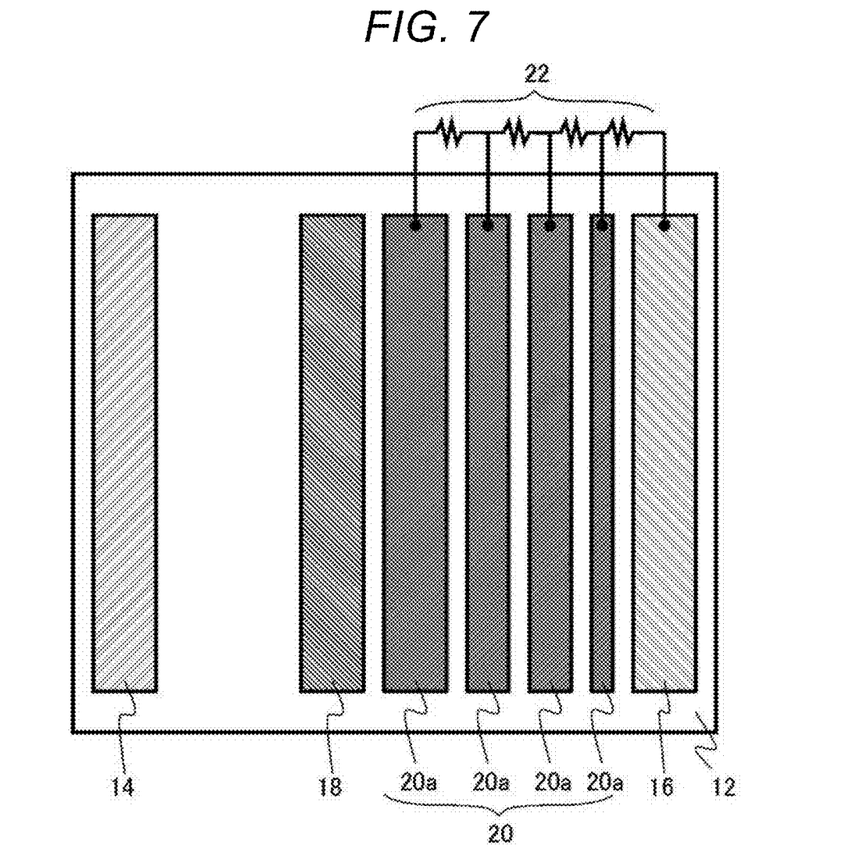
FIG. 7 is a schematic plan view illustrating the semiconductor device according to the fourth embodiment.

FIG. 6 is a schematic cross-sectional view illustrating the semiconductor device according to this fourth embodiment. FIG. 7 is a schematic plan view illustrating the semiconductor device according to this fourth embodiment.

As illustrated in FIG. 6 and FIG. 7, in the semiconductor device according to this fourth embodiment, the plurality of linear portions 20a have different widths, and the linear portion 20a that is closest to the gate electrode 18 has the largest width. Resistance values of the first resistors 22 connected to the linear portions 20a may be set to different values to optimize an amount of electric current which flows in the semiconductor device.

When charge trapping occurs on a surface of the GaN-based semiconductor layer 12, an electrical charge trapped in the vicinity of the gate electrode 18 significantly influences transistor characteristics. According to this fourth embodiment, the coverage by the first conductive layer 20 of layer 12 in the vicinity of the gate electrode 18 becomes relatively large. Accordingly, electrical-charge removal efficiency in the vicinity of the gate electrode 18 may be increased. Accordingly, it is possible to achieve a transistor where a variation in electric characteristics is further suppressed.

Fifth Embodiment

Figure 8:
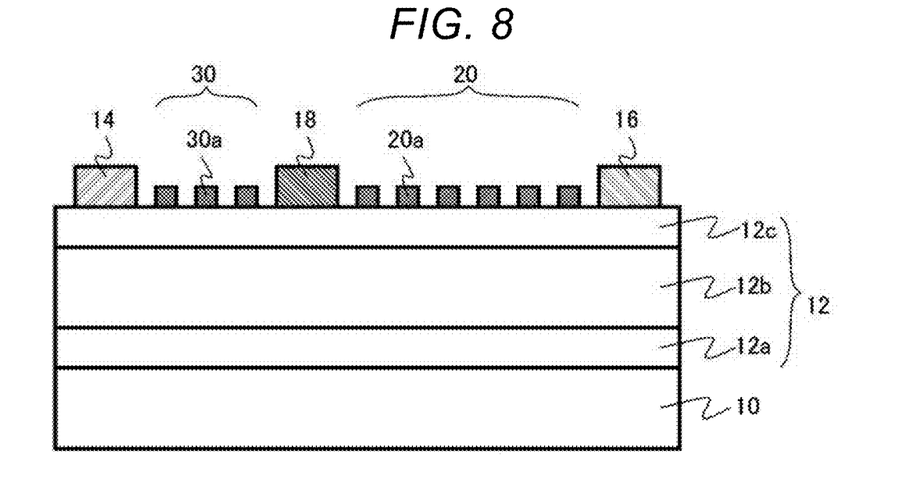
FIG. 8 is a schematic cross-sectional view illustrating a semiconductor device according to a fifth embodiment.
Figure 9:
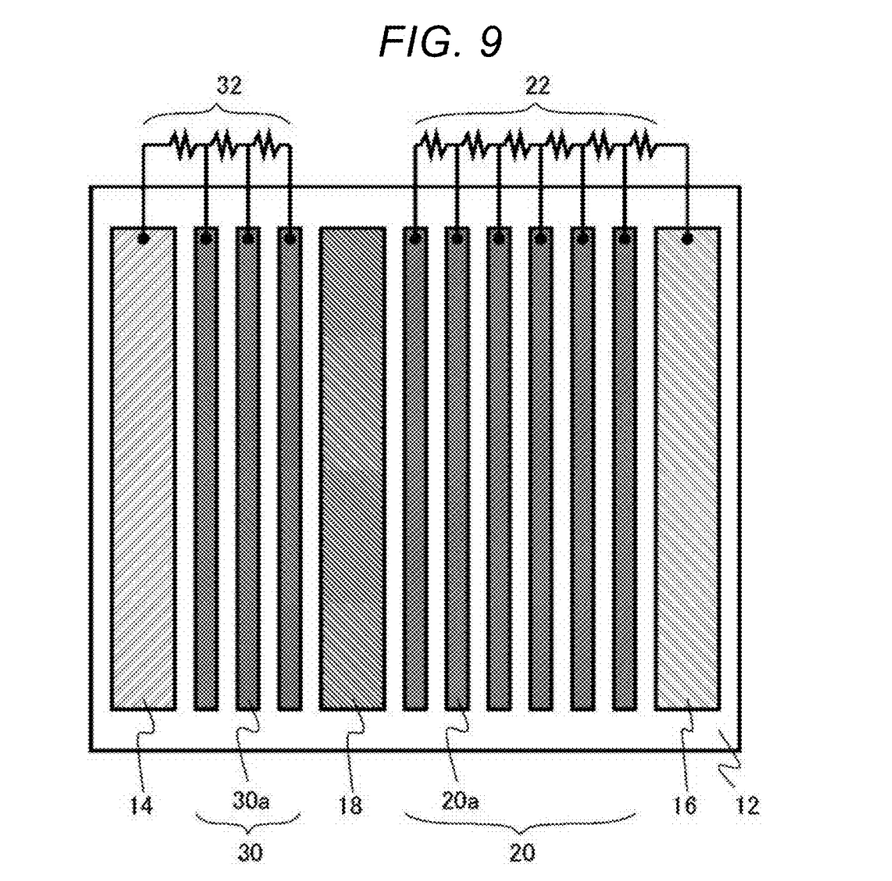
FIG. 9 is a schematic plan view illustrating the semiconductor device according to the fifth embodiment.

FIG. 8 is a schematic cross-sectional view illustrating the semiconductor device according to this fifth embodiment. FIG. 9 is a schematic plan view illustrating the semiconductor device according to this fifth embodiment.

As illustrated in FIG. 8 and FIG. 9, the semiconductor device according to this fifth embodiment includes the second conductive layer 30 which is formed in direct contact with a portion of the GaN-based semiconductor layer 12 between the source electrode 14 and the gate electrode 18. The semiconductor device according to this fifth embodiment further includes the second resistor 32 having a higher resistivity than the second conductive layer 30.

The second conductive layer 30 has a function of removing an electrical charge from the GaN-based semiconductor layer 12, and a function of suppressing the uneven distribution of the electrical charge in the semiconductor device. The electric charge is undesirably generated in the GaN-based semiconductor due to impact ionization, for example.

The second conductive layer 30 is made of metal, for example. The second conductive layer 30 can be a laminated structure formed of a nickel (Ni) layer and a gold (Au) layer, for example. It is desirable that a contact between the second conductive layer 30 and the GaN-based semiconductor layer 12 be a Schottky-type contact.

As illustrated in FIG. 9, the second conductive layer 30 includes a plurality of linear portions 30a which extend parallel to the extension direction of the gate electrode 18. Further, the second conductive layer 30 is electrically connected to the source electrode 14.

The second resistor 32 is formed between the second conductive layer 30 and the source electrode 14. The second resistor 32 has a higher resistivity than the second conductive layer 30.

Although the second resistor 32 is indicated by a circuit symbol in FIG. 9, the second resistor 32 is made of a semiconductor, metal, metal oxide or the like having high resistance. To be more specific, the second resistor 32 can be made of polycrystalline silicon, for example.

The second resistor 32 reduces a voltage between the second conductive layer 30 and the source electrode 14 and any electric current which flows between the second conductive layer 30 and the source electrode 14 by increasing a resistance between the second conductive layer 30 and the source electrode 14 thus decreasing the influence of the second conductive layer 30 exerts on transistor operation.

According to this fifth embodiment, by forming the conductive layer 30 between the source electrode 14 and the gate electrode 18, a charge removal efficiency is enhanced. Accordingly, it is possible to achieve a transistor where a variation in electric characteristics is further suppressed.

By making the plurality of linear portions 30a have different widths and by making the linear portion 30a closest to the gate electrode 18 have the largest width, it is also possible to achieve a transistor where a variation in electric characteristic is further suppressed.

Sixth Embodiment

Figure 10:
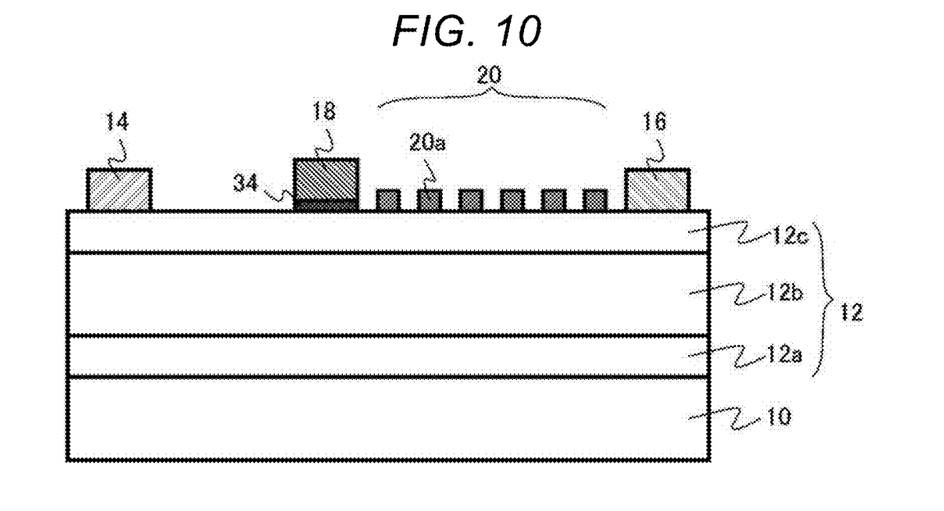
FIG. 10 is a schematic cross-sectional view illustrating a semiconductor device according to a sixth embodiment.

FIG. 10 is a schematic cross-sectional view illustrating the semiconductor device according to this sixth embodiment.

As illustrated in FIG. 10, the semiconductor device according to this embodiment includes the gate insulation layer 34 between the GaN-based semiconductor layer 12 and the gate electrode 18.

According to this sixth embodiment, in the same manner as the first embodiment, it is possible to achieve a transistor where a variation in electric characteristics is suppressed. The semiconductor device according to this embodiment further includes the gate insulation layer 34 and hence, a gate leakage current may be suppressed. Furthermore, a normally-off type transistor may be easily achieved.

Seventh Embodiment

The semiconductor device according to this embodiment includes: a GaN-based semiconductor layer; a source electrode formed on the GaN-based semiconductor layer; a drain electrode formed on the GaN-based semiconductor layer; a gate electrode formed on the GaN-based semiconductor layer between the source electrode and the drain electrode; a first protective layer formed in contact with the GaN-based semiconductor layer between the gate electrode and the drain electrode; and a second protective layer formed on the first protective layer and having a higher resistance than the first protective layer.

Figure 11:
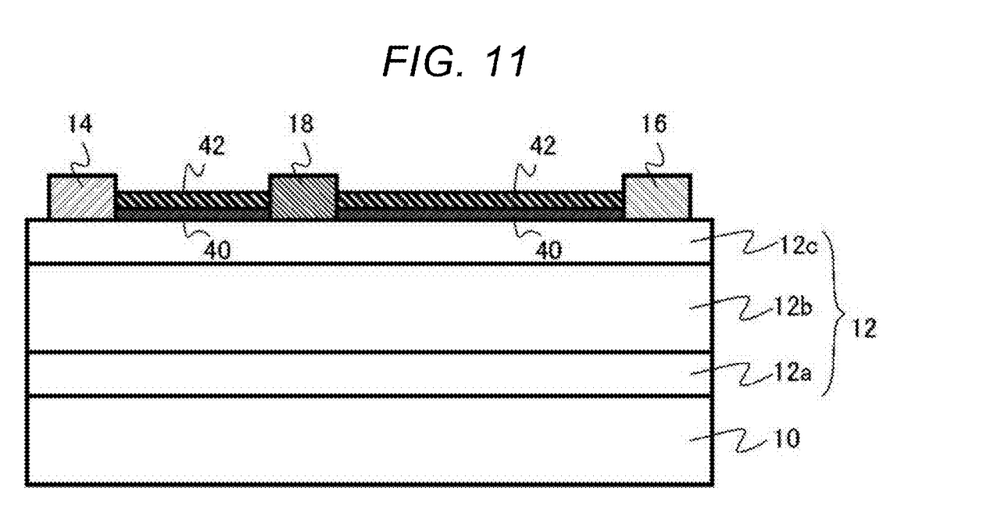
FIG. 11 is a schematic cross-sectional view illustrating a semiconductor device according to a seventh embodiment.

FIG. 11 is a schematic cross-sectional view illustrating the semiconductor device according to this seventh embodiment. The semiconductor device according to this seventh embodiment is a HEMT (High Electron Mobility Transistor) which uses a GaN-based semiconductor.

The semiconductor device according to this seventh embodiment includes: a substrate 10; a GaN-based semiconductor layer 12; a source electrode 14; a drain electrode 16; a gate electrode 18; a first protective layer 40; and a second protective layer 42. The substrate 10 is made of GaN, for example. The substrate 10 may also be a substrate made of SiC, Si, gallium oxide, sapphire or the like in place of a substrate made of GaN.

The GaN-based semiconductor layer 12 is formed on the substrate 10. The GaN-based semiconductor layer 12 includes a buffer layer 12a, a GaN layer 12b and an AlGaN layer 12c from a substrate 10 side. In this manner, the GaN-based semiconductor layer 12 has the laminated structure including the GaN layer 12b and the AlGaN layer 12c.

A front surface of the GaN-based semiconductor layer 12 makes an angle of 0 degree or more to 1 degree or less with respect to a c plane, for example. The crystal structure of the GaN-based semiconductor may approximate the hexagonal crystal structure. A plane of a hexagonal column where a c axis extending along an axial direction of the hexagonal column is set as a normal line (top plane of the hexagonal column) forms a c plane, that is, a (0001) plane.

The buffer layer 12a has a function of alleviating a lattice mismatch between the substrate 10 and the GaN-based semiconductor layer 12. The buffer layer 12a has the multilayer structure formed of an AlGaN layer and a GaN layer, for example. A semiconductor expressed by a composition formula of $Al_xGa_{1-x}N$ (0<x<0.3) is used for forming the AlGaN layer 12c, for example.

The semiconductor device according to this embodiment is HEMT where the GaN layer 12b serves as a so-called "operation layer" (channel layer), and the AlGaN layer 12c serves as a so-called "barrier layer" (electron supply layer).

The source electrode 14 and the drain electrode 16 are made of a conductor such as metal. It is desirable that the contact between the source electrode 14 and the GaN-based semiconductor layer 12 and the contact between the drain electrode 16 and the GaN-based semiconductor layer 12 be ohmic contact. The source electrode 14 and the drain electrode 16 have the laminated structure formed of a titanium (Ti) layer and an aluminum (Al) layer, for example.

The gate electrode 18 is made of a conductor such as metal. It is desirable that a contact between the gate electrode 18 and the GaN-based semiconductor layer 12 be a Schottky contact. The gate electrode 18 has the laminated structure formed of a nickel (Ni) layer and a gold (Au) layer, for example.

The first protective layer (Passivation Layer) 40 is formed in contact with the GaN-based semiconductor layer 12 between the source electrode 14 and the gate electrode 18 as well as between the gate electrode 18 and the drain electrode 16. In this embodiment, the first protective layer 40 is formed in contact with the AlGaN layer 12c.

The first protective layer 40 is an insulation layer doped with a conductive dopant. The first protective layer comprises silicon oxide, silicon nitride, silicon oxynitride or aluminum oxide and includes gallium (Ga), iron (Fe), chromium (Cr) or nickel (Ni) as a dopant, for example. From a viewpoint of allowing the first protective layer 40 to obtain an appropriate conductivity, it is typically desirable that a concentration of the dopant be equal to $1 \times 10^{18}$ cm$^{-3}$ or more. Further, from a viewpoint of suppressing an influence of excessively large conductivity of the first protective layer 40 exerted on transistor characteristics, it is desirable that a concentration of the dopant be equal to $1 \times 10^{21}$ cm$^{-3}$ or less, and more desirably equal to $1 \times 10^{20}$ cm$^{-3}$ or less. In some embodiments of a semiconductor device the first protective layer is made of silicon oxide, silicon nitride, silicon oxynitride, or aluminum oxide which contains gallium (Ga), iron (Fe), chromium (Cr), or nickel (Ni) at the concentration of $1 \times 10^{18}$ cm$^{-3}$ or more as a dopant.

The first protective layer 40 has a conductivity at or above a predetermined level and hence, the first protective layer 40 has a function of removing an electrical charge generated in the GaN-based semiconductor layer 12 from the GaN-based semiconductor layer 12, and a function of suppressing uneven distribution of the electrical charge generated in the GaN-based semiconductor layer 12 in the semiconductor device.

The second protective layer 42 is formed on the first protective layer 40. A resistivity of the second protective layer 42 is higher than a resistivity of the first protective layer 40. Further, a sheet resistance of the second protective layer 42 is higher than a sheet resistance of the first protective layer 40. The second protective layer 42 has a function of protecting the GaN-based semiconductor layer 12, respective electrodes and respective wiring layers, and a function of maintaining insulation property therebetween.

In a transistor which uses a GaN-based semiconductor, a variation in transistor characteristics, such as a current collapse, is a drawback. The GaN-based semiconductor is a piezoelectric body so that polarization is generated thus generating an internal electric field. An HEMT makes use of a two-dimensional electron gas which is generated due to the internal electric field. On the other hand, due to the generation of the internal electric field, there exists a possibility that, for example, electrical charges escapes from a two-dimensional electron gas or localization of unexpected electrical charge occurs due to trapping of electrical charges generated by impact ionization. Such escaping of electrical charges and the localization of electrical charges may be factors which bring about the variations in characteristics of the transistor.

In this embodiment, undesired electrical charges in the GaN-based semiconductor layer 12 may be discharged through the first protective layer 40 or may be dispersed in the inside of the first protective layer 40. Due to such a configuration, it is possible to prevent the occurrence of the unintended localization and the uneven distribution of an electrical charge. As a result, a variation in transistor characteristics such as a current collapse may be suppressed.

When an electrical charge is trapped on a surface of the GaN-based semiconductor layer 12 between the gate electrode and the drain electrode 16, the electrical charge significantly influences transistor characteristics. By forming the first protective layer 40 between the gate electrode 18 and the drain electrode 16, a variation in transistor characteristics may be effectively suppressed. Further, the first protective layer 40 formed between the source electrode 14 and the gate electrode 18 also contributes to the suppression of a variation in transistor characteristics.

In some embodiments, the first protective layer 40 may be formed only between the gate electrode 18 and the drain electrode 16.

From a viewpoint of allowing the first protective layer 40 to effectively remove and disperse an electrical charge, it is desirable that a sheet resistance of the first protective layer 40 be equal to 100 k$\Omega$/☐ or more. Also from a viewpoint of suppressing the influence of an electrical charge from the first protective layer 40 on transistor characteristics, it is desirable that a sheet resistance of the first protective layer 40 be equal to 10,000 k$\Omega$/☐ or less. A sheet resistance of the first protective layer 40 may be determined from the calculation of resistivity by measuring a current-voltage characteristic of the first protective layer 40, and the measurement of a layer thickness of the first protective layer 40 by a TEM (Transmission Electron Microscope).

Further, from a viewpoint of suppressing an influence of an electrical charge from the first protective layer 40 on transistor characteristics, it is desirable that a sheet resistance of the first protective layer 40 be equal to 1,000 or more times larger than a sheet resistance of a two-dimensional electron gas formed at an interface between the GaN layer 12b and the AlGaN layer 12c. A sheet resistance of a two-dimensional electron gas may be determined from transistor characteristics.

Eighth Embodiment

Figure 12:
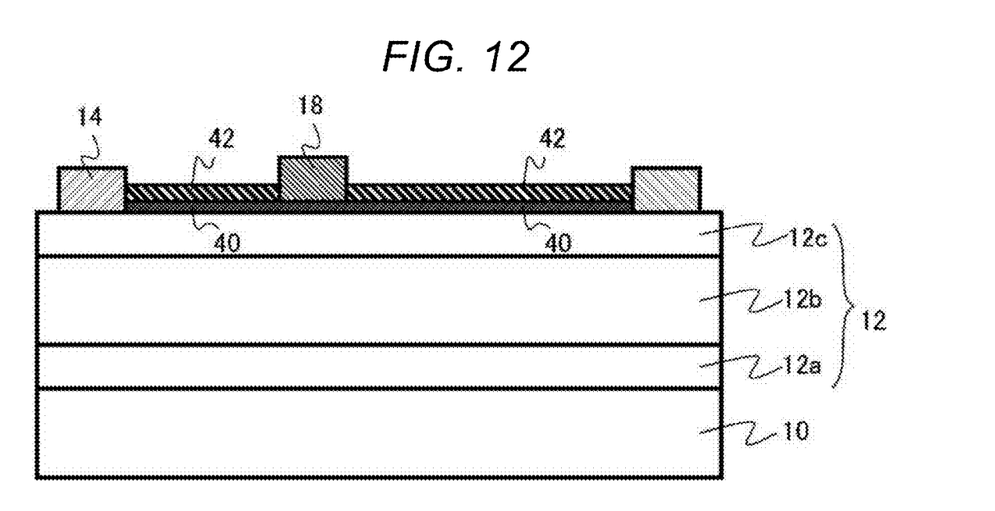
FIG. 12 is a schematic cross-sectional view illustrating a semiconductor device according to an eighth embodiment.

FIG. 12 is a schematic cross-sectional view illustrating the semiconductor device according to this eighth embodiment.

As illustrated in FIG. 12, the semiconductor device according to this embodiment includes the first protective layer 40 between the GaN-based semiconductor layer 12 and the gate electrode 18. The first protective layer 40 below the gate electrode 18 functions as a gate insulation layer.

In the same manner as the seventh embodiment, it is possible to achieve a transistor where a variation in electric characteristics is suppressed. The semiconductor device according to this eighth embodiment further includes the gate insulation layer and hence, a gate leakage current may be suppressed. Further, a normally-off type transistor may be easily achieved.

In the present disclosure, the explanation has been made mainly with respect to cases where the GaN-based semiconductor layer 12 has the laminated structure formed of a GaN layer or a GaN layer and an AlGaN layer. However, a GaN-based semiconductor having other compositions or a semiconductor layer having the different laminated structure may be used as the GaN-based semiconductor layer.

In the above-mentioned embodiment, the explanation has been made with respect to an HEMT which uses a two-dimensional electron gas as an example. However, the present invention is also applicable to a Metal Insulator Semiconductor Field Effect Transistor (MISFET) which does not use a two-dimensional electron gas.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a GaN-based semiconductor layer;
    a source electrode and a drain electrode spaced from each other on the GaN-based semiconductor layer in a first direction;
    a gate electrode between the source electrode and the drain electrode in the first direction;
    a first conductive layer contacting a surface of the GaN-based semiconductor layer between the gate electrode and the drain electrode in the first direction, wherein the first conductive layer is electrically connected to the drain electrode and is not electrically connected to the source electrode; and
    a first resistive element having a resistivity that is greater than a resistivity of the first conductive layer, the first resistive element being in an electrical path between the first conductive layer and the drain electrode.

2. The semiconductor device according to claim 1, wherein the first conductive layer includes a plurality of portions spaced from each other in the first direction and extending in a second direction parallel to the surface of the GaN-based semiconductor layer and perpendicular to the first direction.

3. The semiconductor device according to claim 2, wherein each portion in the plurality of portions has a width in the first direction that is different from each other portion, and
    a portion in the plurality of portions that is closest to the gate electrode in the first direction is wider in the first direction than each other portion in the plurality of portions.

4. The semiconductor device according to claim 2, wherein a portion in the plurality of portions that is closest to the gate electrode in the first direction is wider in the first direction than each other portion in the plurality of portions.

5. The semiconductor device according to claim 1, wherein the first conductive layer comprises a metal.

6. The semiconductor device according to claim 1, wherein the first conductive layer is in Schottky-type contact with the GaN-based semiconductor layer.

7. The semiconductor device according to claim 1, wherein the GaN-based semiconductor layer and the first conductive layer are in Schottky-type contact.

8. The semiconductor device according to claim 1, further comprising:
    a second conductive layer contacting the surface of the GaN-based semiconductor layer between the gate electrode and the source electrode in the first direction.

9. The semiconductor device according to claim 8, wherein the second conductive layer is electrically connected to the source electrode.

10. The semiconductor device according to claim 1, wherein the first conductive layer extends in a first direction from the drain electrode to the source electrode.

11. The semiconductor device according to claim 1, wherein the first conductive layer comprises an insulation material that has been doped with a conductive impurity so as to have a sheet resistance between 100 k$\Omega$/☐ and 10,000 k$\Omega$/☐, inclusive.

* * * * *